United States Patent
Taylor, III et al.

(10) Patent No.: US 12,408,396 B1
(45) Date of Patent: Sep. 2, 2025

(54) FIELD-EFFECT TRANSISTORS WITH HETEROGENOUS DOPED REGIONS IN THE SUBSTRATE OF A SILICON-ON-INSULATOR SUBSTRATE

(71) Applicant: GlobalFoundries U.S. Inc., Malta, NY (US)

(72) Inventors: Richard Taylor, III, Campbell, CA (US); Andreas Knorr, Saratoga Springs, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/814,235

(22) Filed: Aug. 23, 2024

(51) Int. Cl.
  *H10D 86/00* (2025.01)
  *H10D 62/13* (2025.01)
  *H10D 64/23* (2025.01)

(52) U.S. Cl.
  CPC ......... *H10D 62/151* (2025.01); *H10D 64/256* (2025.01); *H10D 86/201* (2025.01)

(58) Field of Classification Search
  CPC .................................................. H10D 86/201
  See application file for complete search history.

(56) References Cited

U.S. PATENT DOCUMENTS

| | | |
|---|---|---|
| 9,660,034 B1 | 5/2017 | Galy |
| 10,658,390 B2 | 5/2020 | Nowak et al. |
| 2010/0156510 A1 | 6/2010 | Botula et al. |
| 2013/0009725 A1 | 1/2013 | Heaney et al. |
| 2017/0154964 A1 | 6/2017 | Kjar |
| 2018/0366484 A1* | 12/2018 | Richter ................ H10D 62/115 |
| 2019/0051747 A1 | 2/2019 | Cortes Mayol et al. |
| 2019/0371943 A1* | 12/2019 | Liu ........................ H10D 86/01 |
| 2023/0040844 A1* | 2/2023 | Lee ...................... H10D 86/201 |
| 2024/0120420 A1 | 4/2024 | Dünkel et al. |

FOREIGN PATENT DOCUMENTS

FR    3048304 A1    9/2017

OTHER PUBLICATIONS

Hiramoto et al.: "Device Design of Nanoscale Mosfets Considering the Suppression of Short Channel Effects and Characteristics Variations.", IEICE Trans. Electron., vol. E90-C, No. 4; pp. 836-841 Apr. 2007.
European Patent Office; Extended European Search Report and Opinion issued in European Patent Application No. 25158718.4 on Jul. 17, 2025; 8 pages.

* cited by examiner

*Primary Examiner* — Christopher A Johnson
(74) *Attorney, Agent, or Firm* — Thompson Hine LLP; Francois Pagette (57) ABSTRACT

Structures for a field-effect transistor and methods of forming a structure for a field-effect transistor. The structure comprises a silicon-on-insulator substrate including a semiconductor layer, a semiconductor substrate, and a dielectric layer between the semiconductor layer and the semiconductor substrate. The semiconductor substrate includes first and second doped regions, the first doped region has a first conductivity type, and the second doped region has a second conductivity type different from the first conductivity type. The structure further comprises first and second source/drain regions in the semiconductor layer, and a gate structure laterally between the first source/drain region and the second source/drain region. The first source/drain region overlaps with the first doped region, and the second source/drain region overlaps with the second doped region.

20 Claims, 9 Drawing Sheets

FIELD-EFFECT TRANSISTORS WITH HETEROGENOUS DOPED REGIONS IN THE SUBSTRATE OF A SILICON-ON-INSULATOR SUBSTRATE

BACKGROUND

The disclosure relates to semiconductor device fabrication and integrated circuits and, more specifically, to structures for a field-effect transistor and methods of forming a structure for a field-effect transistor.

Device structures for a field-effect transistor generally include a source region, a drain region, a channel region arranged between the source region and the drain region, and a gate electrode configured to switch carrier flow in the channel region between the source region and drain region. The channel of a planar field-effect transistor is arranged in a semiconductor body beneath the top surface of a substrate on which the gate electrode is disposed. When a control voltage exceeding a designated threshold voltage is applied to the gate electrode, the flow of carriers in the channel region produces a device output current.

Improved structures for a field-effect transistor and methods of forming a structure for a field-effect transistor are needed.

SUMMARY

In an embodiment of the invention, a structure comprises a silicon-on-insulator substrate including a semiconductor layer, a semiconductor substrate, and a dielectric layer between the semiconductor layer and the semiconductor substrate. The semiconductor substrate includes a first doped region and a second doped region, the first doped region has a first conductivity type, and the second doped region has a second conductivity type different from the first conductivity type. The structure further comprises a first source/drain region in the semiconductor layer, a second source/drain region in the semiconductor layer, and a gate structure that is laterally between the first source/drain region and the second source/drain region. The first source/drain region overlaps with the first doped region, and the second source/drain region overlaps with the second doped region.

In an embodiment of the invention, a method comprises forming a first doped region and a second doped region in a semiconductor substrate of a silicon-on-insulator substrate. The silicon-on-insulator substrate includes a semiconductor layer and a dielectric layer between the semiconductor layer and the semiconductor substrate, the first doped region has a first conductivity type, and the second doped region has a second conductivity type different from the first conductivity type. The method further comprises forming a first source/drain region in the semiconductor layer, forming a second source/drain region in the semiconductor layer, and forming a gate structure that is laterally between the first source/drain region and the second source/drain region. The first source/drain region overlaps with the first doped region, and the second source/drain region overlaps with the second doped region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
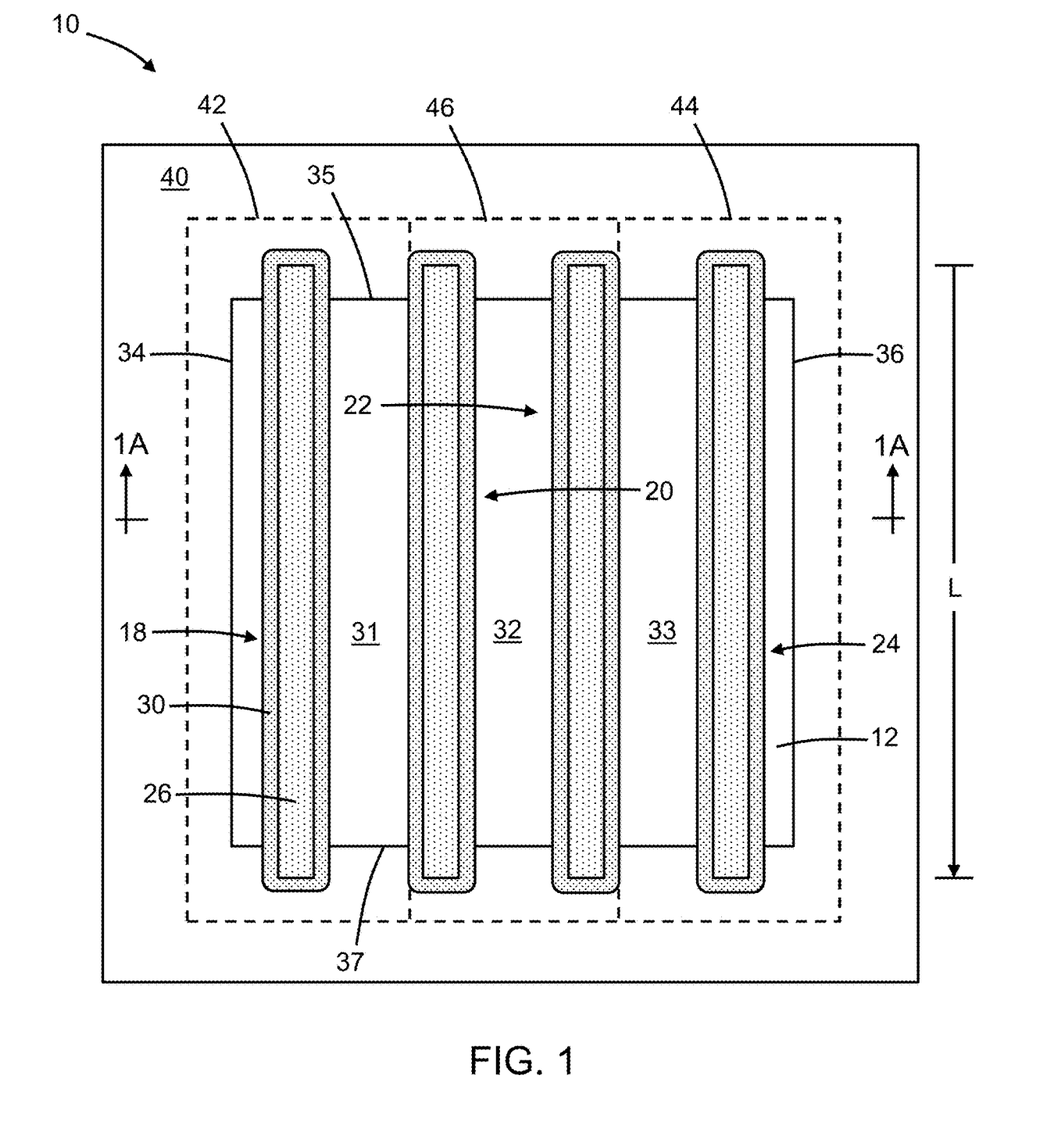
FIG. 1 is a top view of a structure at an initial fabrication stage of a processing method in accordance with embodiments of the invention.
Figure 1A:
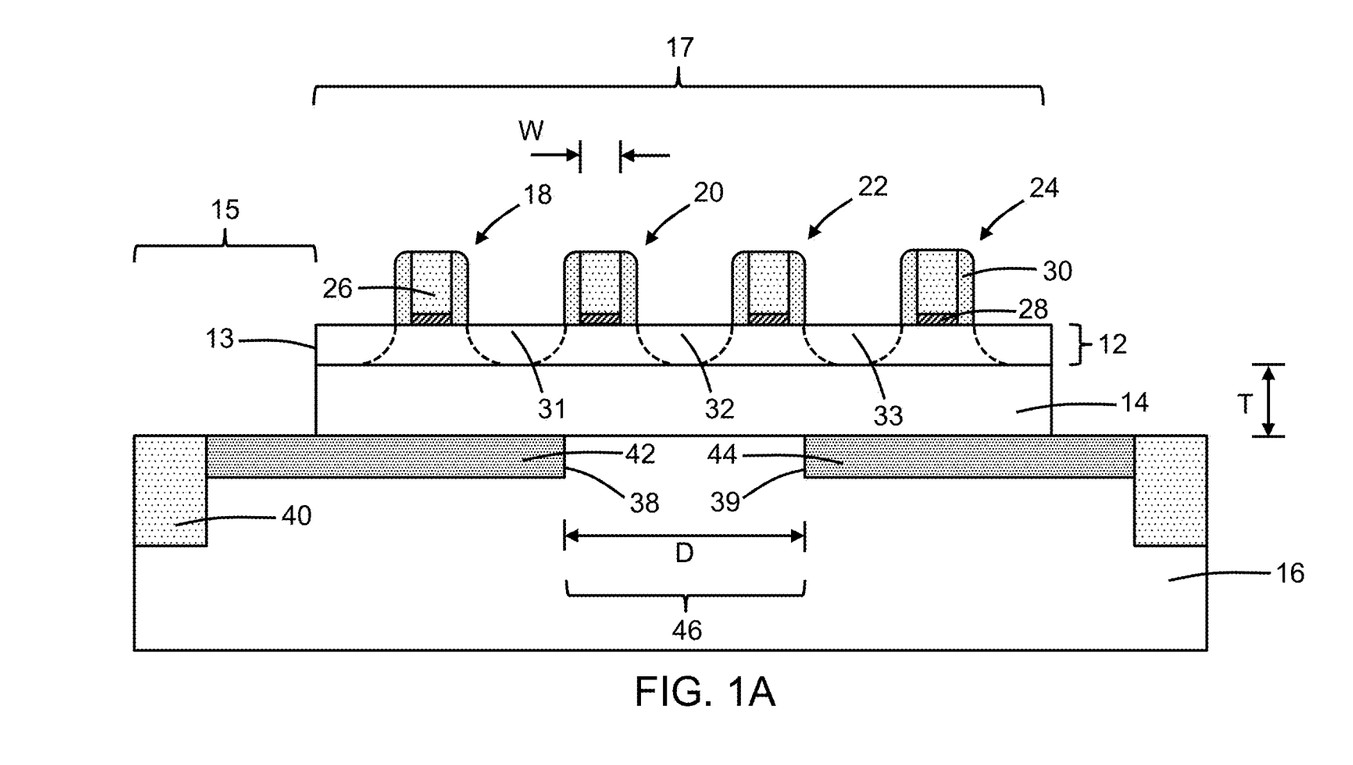
FIG. 1A is a cross-sectional view taken generally along line 1A-1A in FIG. 1.

With reference to FIGS. 1, 1A and in accordance with embodiments of the invention, a structure 10 for a field-effect transistor may be fabricated using a silicon-on-insulator substrate that includes a semiconductor layer 12, a semiconductor substrate 16, and a dielectric layer 14 disposed in a vertical direction between the semiconductor layer 12 and the semiconductor substrate 16. The semiconductor layer 12, which is physically separated and electrically isolated from the semiconductor substrate 16 by the intervening dielectric layer 14, may be significantly thinner than the semiconductor substrate 16. The dielectric layer 14 has a lower interface with the semiconductor substrate 16 and an upper interface with the semiconductor layer 12. In an embodiment, the semiconductor substrate 16 may connected to electrical ground.

The semiconductor layer 12 may be comprised of a single-crystal semiconductor material, such as single-crystal silicon. The dielectric layer 14 may be comprised of a dielectric material, such as silicon dioxide, that is an electrical insulator. The semiconductor substrate 16 may be comprised of a single-crystal semiconductor material, such as single-crystal silicon, that is lightly doped to have, for example, p-type conductivity and a high resistivity. As used herein, a single-crystal semiconductor material is characterized by a continuous crystal lattice and the absence of grain boundaries.

In an embodiment, the dielectric layer 14 may be a buried oxide layer of a silicon-on-insulator substrate, the semiconductor layer 12 may be a device layer of the silicon-on-insulator substrate, and the buried oxide layer provided by the dielectric layer 14 may separate the device layer provided by the semiconductor layer 12 from the semiconductor substrate 16. In an embodiment, the semiconductor layer 12 of the silicon-on-insulator substrate may have a thickness suitable to fabricate fully-depleted silicon-on-insulator device structures. In an embodiment, the semiconductor layer 12 may have a thickness T in a range of about 4 nanometers to about 40 nanometers.

Portions of the semiconductor layer 12 and the dielectric layer 14 may be patterned and removed by lithography and etching to provide a hybrid region 15 in which the semiconductor substrate 16 is exposed. The hybrid region 15 may surround an active region 17 that includes unetched portions of the semiconductor layer 12 and the dielectric layer 14. The semiconductor layer 12 has side edges 34, 35, 36, 37 that surround the perimeter of the active region 17 and define a step transition from the active region 17 to the hybrid region 15.

The structure 10 may include gate structures 18, 20, 22, 24 that are formed on the top surface of the semiconductor layer 12 with a given pitch P. Each of the gate structures 18, 20, 22, 24 may include a gate electrode 26 and a gate dielectric layer 28 that are arranged in a layer stack. A dielectric spacer 30 that surrounds the gate electrode 26 and gate dielectric layer 28 of each of the gate structures 18, 20, 22, 24. The gate electrode 26 may be comprised of a conductive material, such as doped polycrystalline silicon, that is an electrical conductor, the gate dielectric layer 28 may be comprised of a dielectric material, such as silicon dioxide, that is an electrical insulator, and the dielectric spacer 30 may be comprised of a dielectric material, such as silicon nitride, that is an electrical insulator. Each of the gate structures 18, 20, 22, 24 has a length L measured along its longest dimension, and the gate structures 18, 20, 22, 24 may extend lengthwise from the side edge 35 to the side edge 37. Each of the gate structures 18, 20, 22, 24 has a width W measured transverse to the length L. In an alternative embodiment, additional gate structures like gate structures 20, 22 may be inserted into the space between the gate structure 18 and the gate structure 24.

The structure 10 may include a source/drain region 31 that is formed in the semiconductor layer 12 in the space between the gate structure 18 and the gate structure 20, a source/drain region 32 that is formed in the semiconductor layer 12 in the space between the gate structure 20 and the gate structure 22, and a source/drain region 33 that is formed in the semiconductor layer 12 in the space between the gate structure 22 and the gate structure 24. As used herein, the term "source/drain region" means a region of semiconductor material that can function as either a source or a drain of a field-effect transistor. The source/drain regions 31, 32, 33 may be formed by ion implantation or plasma-immersion ion implantation of the semiconductor layer 12. In an embodiment, the source/drain regions 31, 32, 33 may be doped with a concentration of an n-type dopant, such as arsenic or phosphorus, that provides n-type conductivity. In an alternative embodiment, the source/drain regions 31, 32, 33 may be doped with a concentration of a p-type dopant, such as boron, that provides p-type conductivity. In an embodiment, the source/drain regions 31, 33 may be source regions of the field-effect transistor embodied in the structure 10, and the source/drain region 32 may be the drain region of the field-effect transistor embodied in the structure 10.

A well 40 may be formed in the semiconductor substrate 16 within the hybrid region 15. In an embodiment, the well 40 may provide a guard ring that surrounds a perimeter 13 of the semiconductor layer 12 in the active region 17. In an alternative embodiment, the well 40 may surround only a portion of the perimeter 13 of the semiconductor layer 12 in the active region 17. In an embodiment, the well 40 may contain a concentration of an n-type dopant, such as arsenic or phosphorus, to provide n-type conductivity. The well 40 may be concurrently formed by implanting ions, such as ions including the n-type dopant, with an implantation mask having an opening defining the intended location for the well 40 in the semiconductor substrate 16. The implantation conditions, such as ion species, dose, and kinetic energy, may be selected to tune the electrical and physical characteristics of the well 40.

Doped regions 42, 44 may be formed in respective portions of the semiconductor substrate 16 beneath the dielectric layer 14. In an embodiment, the doped regions 42, 44 may contain a concentration of an n-type dopant, such as arsenic or phosphorus, to provide n-type conductivity. The doped regions 42, 44 may be concurrently formed by selectively implanting ions, such as ions including the n-type dopant, with an implantation mask having openings defining the intended locations for the doped regions 42, 44 in the semiconductor substrate 16. The implantation conditions, such as ion species, dose, and kinetic energy, may be selected to tune the electrical and physical characteristics of the doped regions 42, 44. In an embodiment, the ion implantation forming the doped regions 42, 44 may be self-aligned to the gate structure 20 and the gate structure 22.

A doped region 46 is laterally positioned between the doped region 42 and the doped region 44. The doped region 46 represents a portion of the semiconductor substrate 16 that is masked by the implantation mask when the ion implantation forming the doped regions 42, 44 is performed and, consequently, that inherits the doping of the semiconductor substrate 16. The doped region 46 has an opposite conductivity type from the doped regions 42, 44. In an embodiment, the doped region 46 may have p-type conductivity if the doped regions 42, 44 have n-type conductivity.

The doped region 42 may extend in the semiconductor substrate 16 from the side edge 35 of the semiconductor layer 12 to the opposite side edge 37 of the semiconductor layer 12, as well as outwardly beyond the side edge 34, the side edge 35, and the side edge 37 into the hybrid region 15 to intersect the well 40. The doped region 44 may extend in the semiconductor substrate 16 from the side edge 35 of the semiconductor layer 12 to the opposite side edge 37 of the semiconductor layer 12, as well as outwardly beyond the side edge 34, the side edge 35, and the side edge 36 into the hybrid region 15 to intersect the well 40. The doped region 46 may extend in the semiconductor substrate 16 from the side edge 35 of the semiconductor layer 12 to the opposite side edge 37 of the semiconductor layer 12, as well as outwardly beyond the side edge 35 and the side edge 37 into the hybrid region 15 to intersect the oppositely-doped well 40. The doped region 46 is represented by a strip of the semiconductor material of the semiconductor substrate 16 that is positioned laterally between the doped region 42 and the doped region 44 and that extends from a portion of the well 40 adjacent to the side edge 35 to a portion of the well 40 adjacent to the side edge 37. The doped region 46 may laterally separate the doped region 42 from the doped region 44.

The source/drain region 31 overlaps with the doped region 42, the source/drain region 33 overlaps with the doped region 44, and the source/drain region 32 overlaps with the doped region 46. The source/drain region 31 may fully overlap with the doped region 42, the source/drain region 33 may fully overlap with the doped region 44, and the source/drain region 32 may fully overlap with the doped region 46. The source/drain region 31 is vertically separated from an underlying portion of the doped region 42 by the dielectric layer 14. The source/drain region 32 is vertically separated from an underlying portion of the doped region 46 by the dielectric layer 14. The source/drain region 33 is vertically separated from an underlying portion of the doped region 44 by the dielectric layer 14. The doped regions 42, 44 may extend laterally beneath the perimeter 13 of the semiconductor layer 12 and into the hybrid region 15 to connect to the well 40. The doped regions 42, 44 may extend vertically in the semiconductor substrate 16 to a shallower depth than the well 40.

The doped region 42 and the doped region 46 adjoin along an interface 38. The doped region 44 and the doped region 46 adjoin along an interface 39. The gate structure 20 is aligned with the interface 38, and the gate structure 22 is aligned with the interface 39. The doped region 42 is spaced from the doped region 44 by a distance D greater than twice the width W of any of the gate structures 18, 20, 22, 24. More specifically, the interface 38 is separated from the interface 39 by a distance D greater than twice the width W of any of the gate structures 18, 20, 22, 24. The distance D may be equal to the width of the doped region 46.

Figure 2:
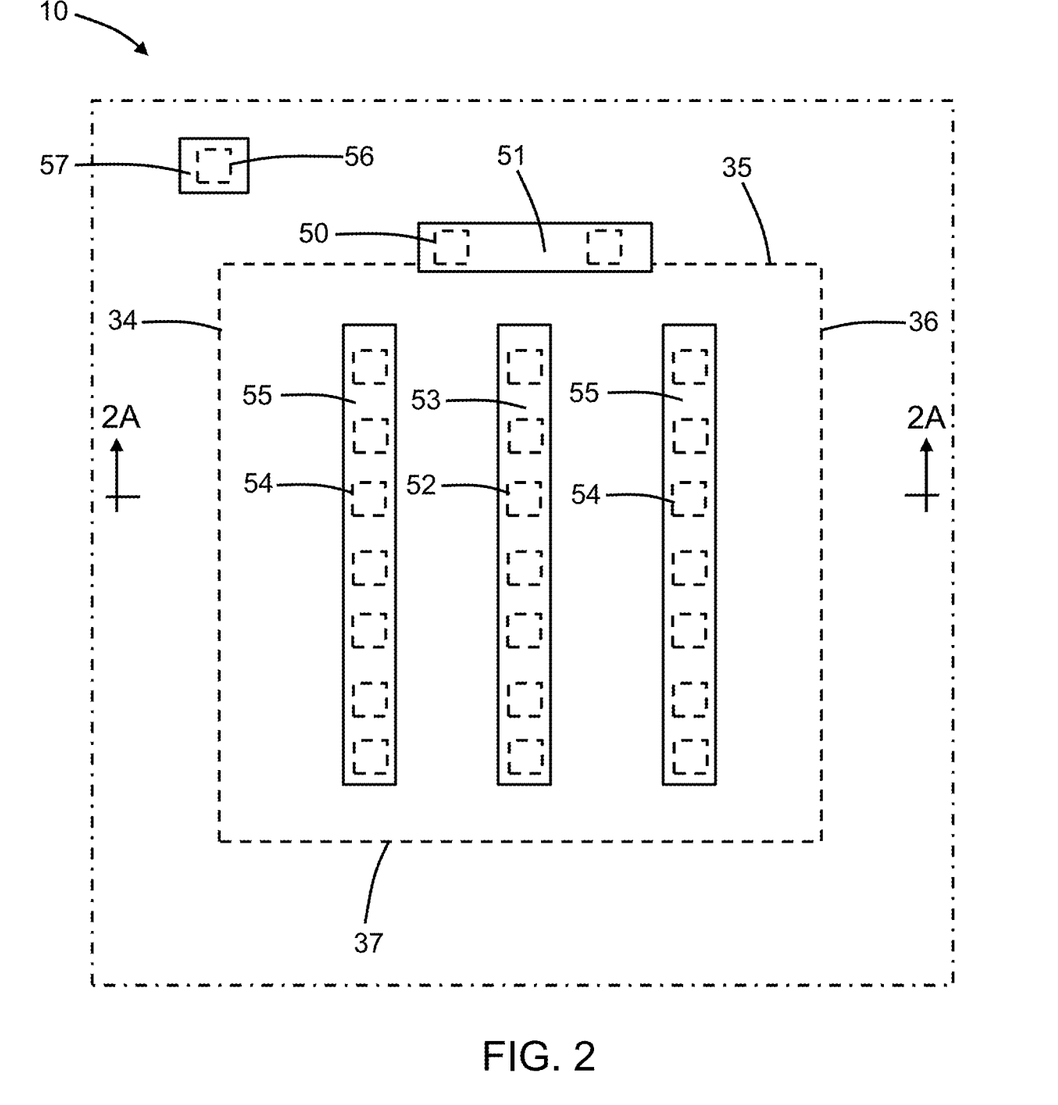
FIG. 2 is a top view of the structure at a fabrication stage of the processing method subsequent to FIGS. 1, 1A.
Figure 2A:
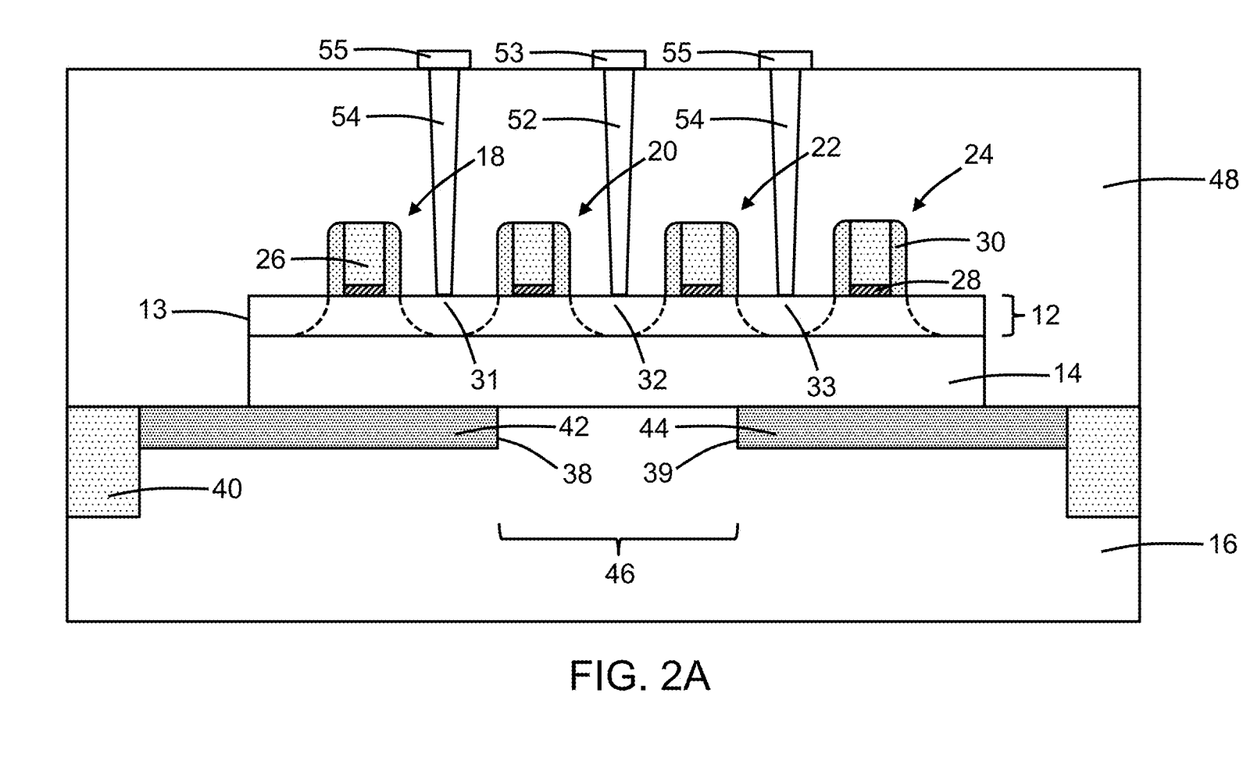
FIG. 2A is a cross-sectional view taken generally along line 2A-2A in FIG. 2.

With reference to FIGS. 2, 2A in which like reference numerals refer to like features in FIGS. 1, 1A and at a subsequent fabrication stage, the structure 10 may further include a contact level having a dielectric layer 48 formed over the hybrid region 15 and the active region 17. The dielectric layer 48 may be comprised of a dielectric material, such as silicon dioxide, that is deposited and planarized. Contacts 50 may be formed in the dielectric layer 48 that are physically and electrically coupled to the gate electrode 26 of the gate structure 20 and the gate electrode 26 of the gate structure 22, contacts 52 may be formed in the dielectric layer 48 that are physically and electrically coupled to the source/drain region 32, and contacts 54 may be formed in the dielectric layer 48 that are physically and electrically coupled to the source/drain regions 31, 33. A contact 56 may be physically and electrically coupled to the well 40 as a well tap, and a bias may be applied to the well 40 via the contact 56. The contacts 50 may be coupled to an overlying metal feature 51 in a back-end-of-line stack, the contacts 52 may be coupled to an overlying metal feature 53 in the back-end-of-line stack, the contacts 54 may be coupled to overlying metal features 55 in the back-end-of-line stack, and the contact 56 may be coupled to an overlying metal feature 57 in the back-end-of-line stack. The gate electrode 26 of the gate structure 18 and the gate electrode 26 of the gate structure 24, which are peripherally arranged relative to the gate structures 20 and 22, are not contacted within the contact level and, for that reason, represent inactive gates in the field-effect transistor.

The field-effect transistor embodied in the structure 10 may represent a common-source amplifier that includes gate fingers represented by the gate structure 20 and the gate structure 22. The gate structures 20, 22 may function as an input terminal to the field-effect transistor, the source/drain region 32 may function as a drain terminal at which output from the field-effect transistor is available, and the source/drain regions 31, 33 may function as source terminals that are connected to ground. The presence of the doped region 46 beneath the source/drain region 32 (i.e., the drain of the common-source amplifier) may lower the capacitance, which may improve radiofrequency matching and drain linearity. A bias applied to the well 40 operates as a connection to the doped regions 42, 44 for draining charge carriers to prevent the formation of an inversion layer in the doped region 46, which may provide an ideal low-frequency response for back-gate capacitance. The structure 10 may exhibit an improved area efficiency and a more consistent field control in comparison with conventional device structures for a common-source amplifier.

Figure 3:
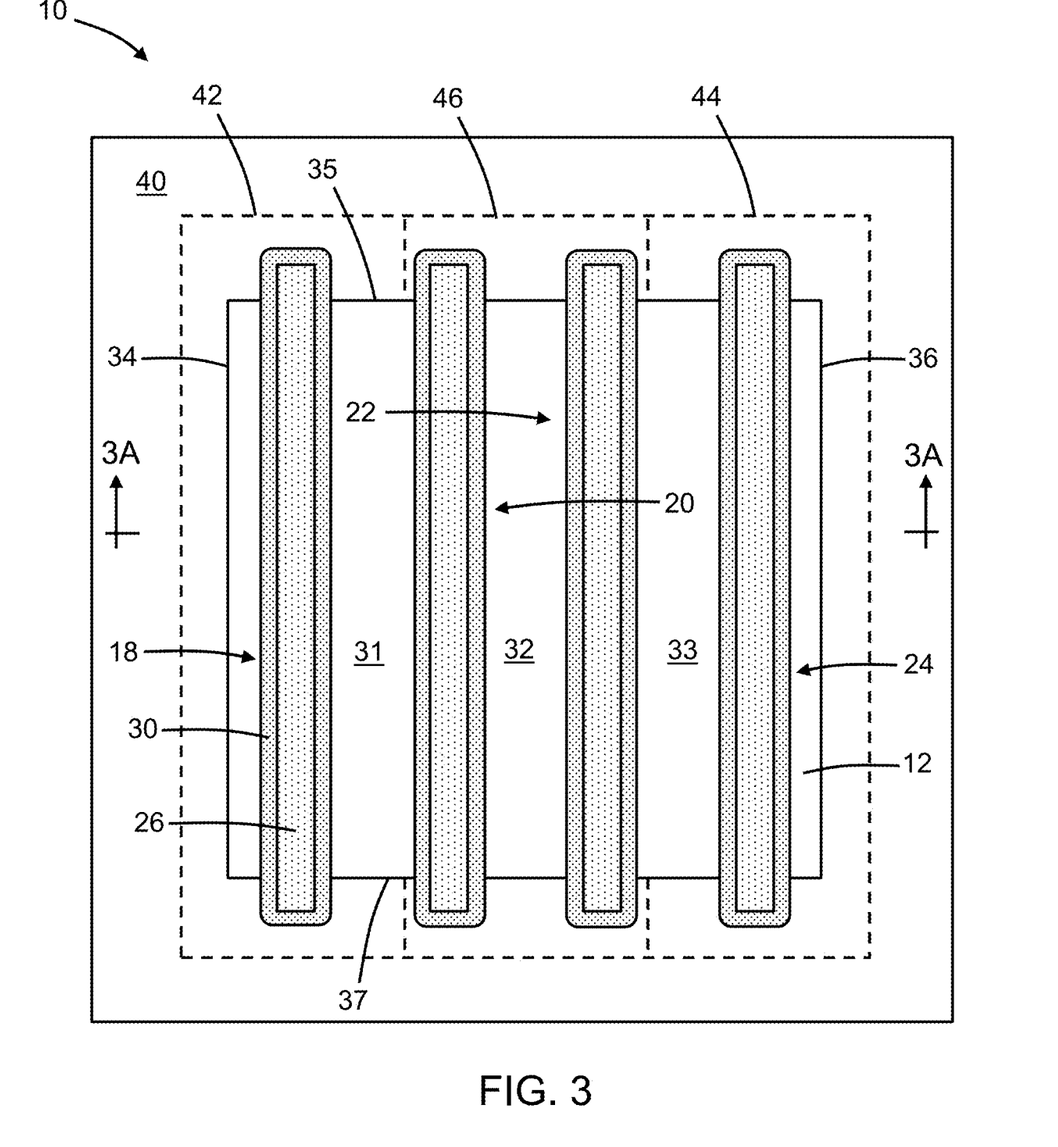
FIG. 3 is a top view of a structure in accordance with alternative embodiments of the invention.
Figure 3A:
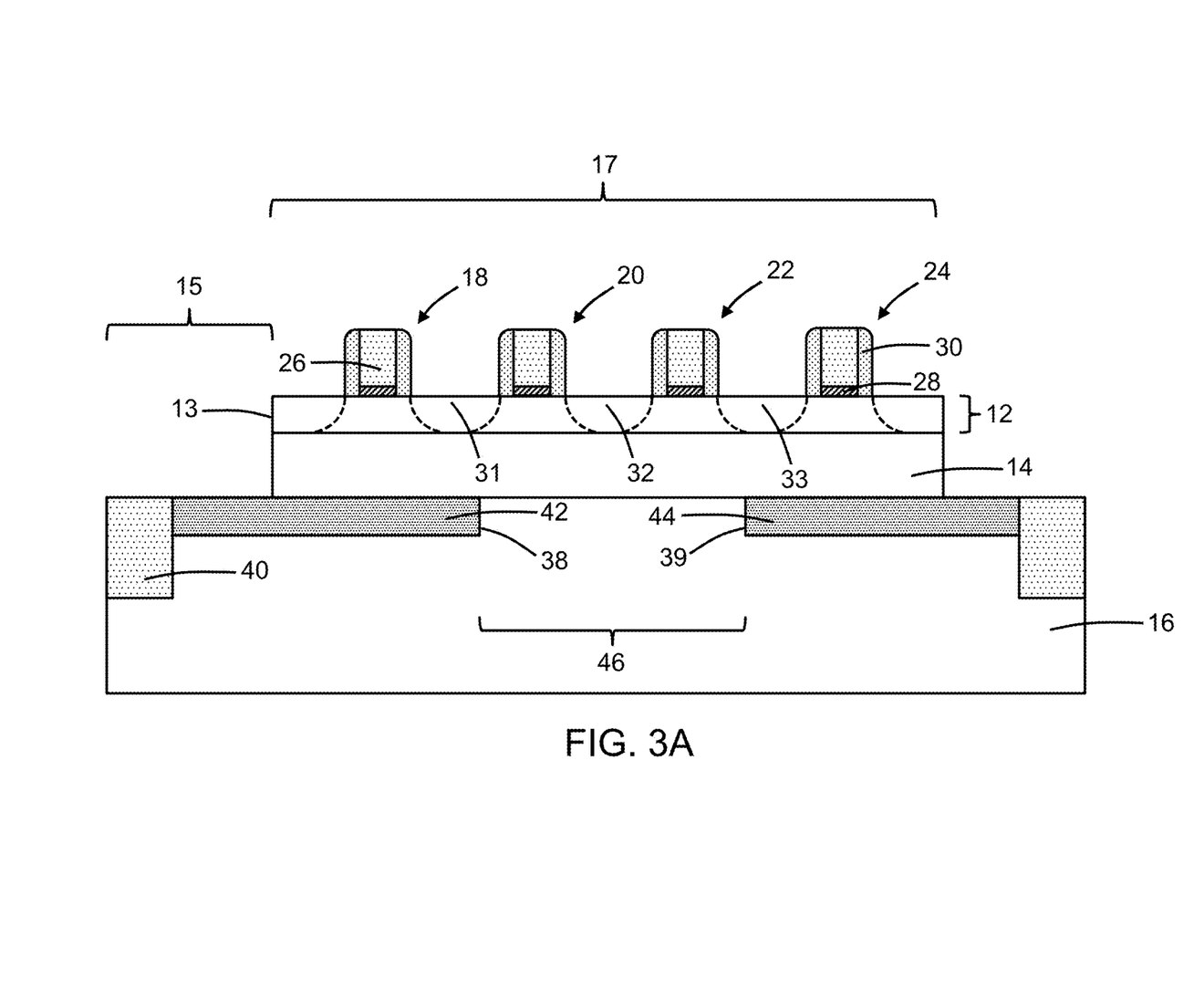
FIG. 3A is a cross-sectional view taken generally along line 3A-3A in FIG. 3.

With reference to FIGS. 3, 3A and in accordance with alternative embodiments, the ion implantation forming the doped regions 42, 44 and doped region 46 may be performed before the gate structures 18, 20, 22, 24 are formed. As a result, the doped regions 42, 44 may not be self-aligned to the gate structures 20, 22. Instead, the gate structure 20 is non-aligned with the interface 38 and the interface 38 may be laterally offset toward the gate structure 18, and the gate structure 22 is non-aligned with the interface 39 and the interface 39 may be laterally offset toward the gate structure 24. The interface 38 may be positioned beneath the source/drain region 31, and the interface 39 may be positioned beneath the source/drain region 33. However, even in the absence of self-alignment of the ion implantation forming the doped regions 42, 44, the doped region 42 is positioned beneath the source/drain region 31, the doped region 44 is positioned beneath the source/drain region 33, and the doped region 46 is positioned beneath the source/drain region 32.

Figure 4:
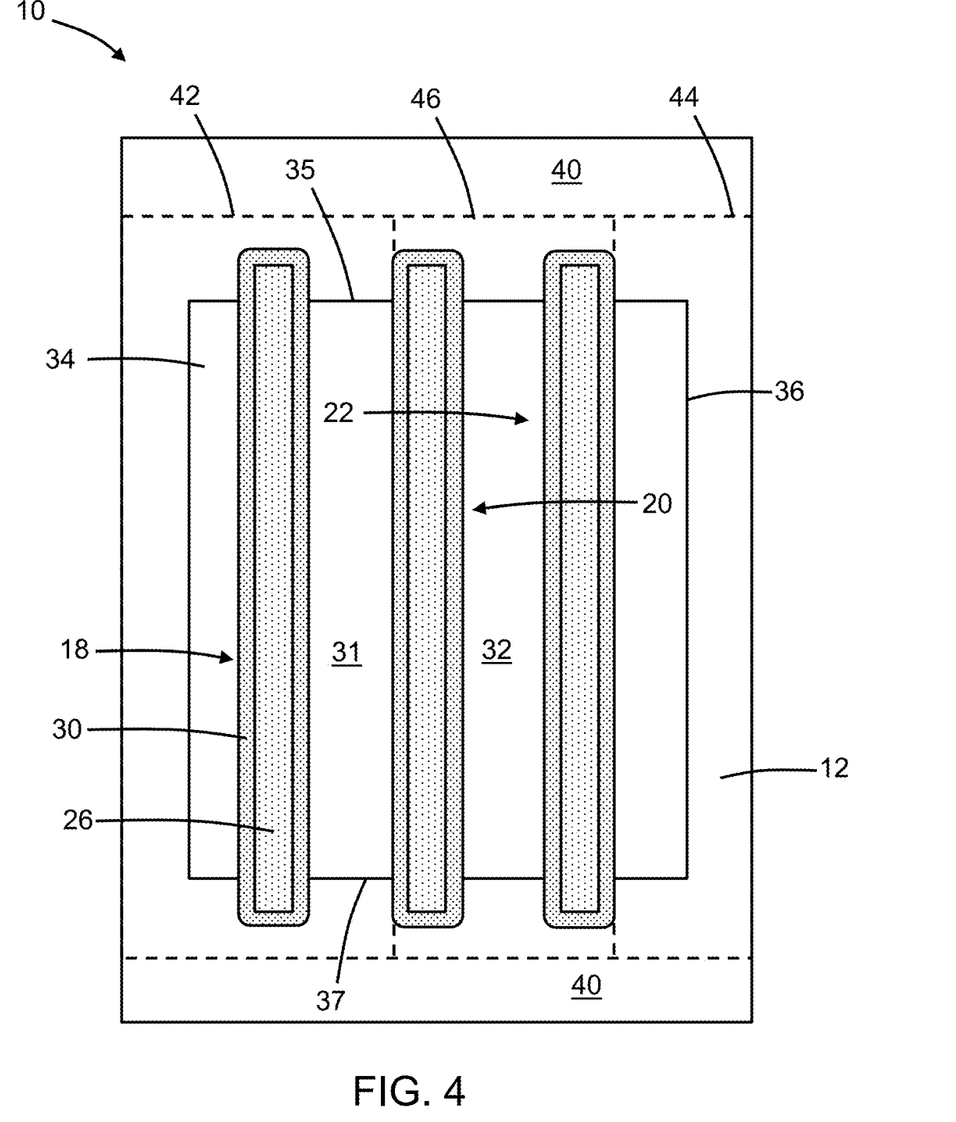
FIG. 4 is a top view of a structure in accordance with alternative embodiments of the invention.

With reference to FIG. 4 and in accordance with alternative embodiments, the gate structure 24 may be eliminated such that the field-effect transistor has a single gate finger represented by gate structure 20. The gate structure 18 and the gate structure 22 are inactive gates in the structure 10. The doped region 42 is positioned beneath the source/drain region 31, and the doped region 46 is positioned beneath the source/drain region 32. In an alternative embodiment, the doped region 42 and the doped region 44 may be formed without self-alignment of the ion implantation forming the doped regions 42, 44. The well 40, which is adjoined to the doped region 42 and the doped region 46, may be located only at the ends of the structure 10 instead of surrounding the active region 17. The structure 10 embodied in the field-effect transistor with the single gate finger may exhibit an improved area efficiency and a more consistent field control in comparison with conventional device structures for a single-gate-finger field-effect transistors.

Figure 5:
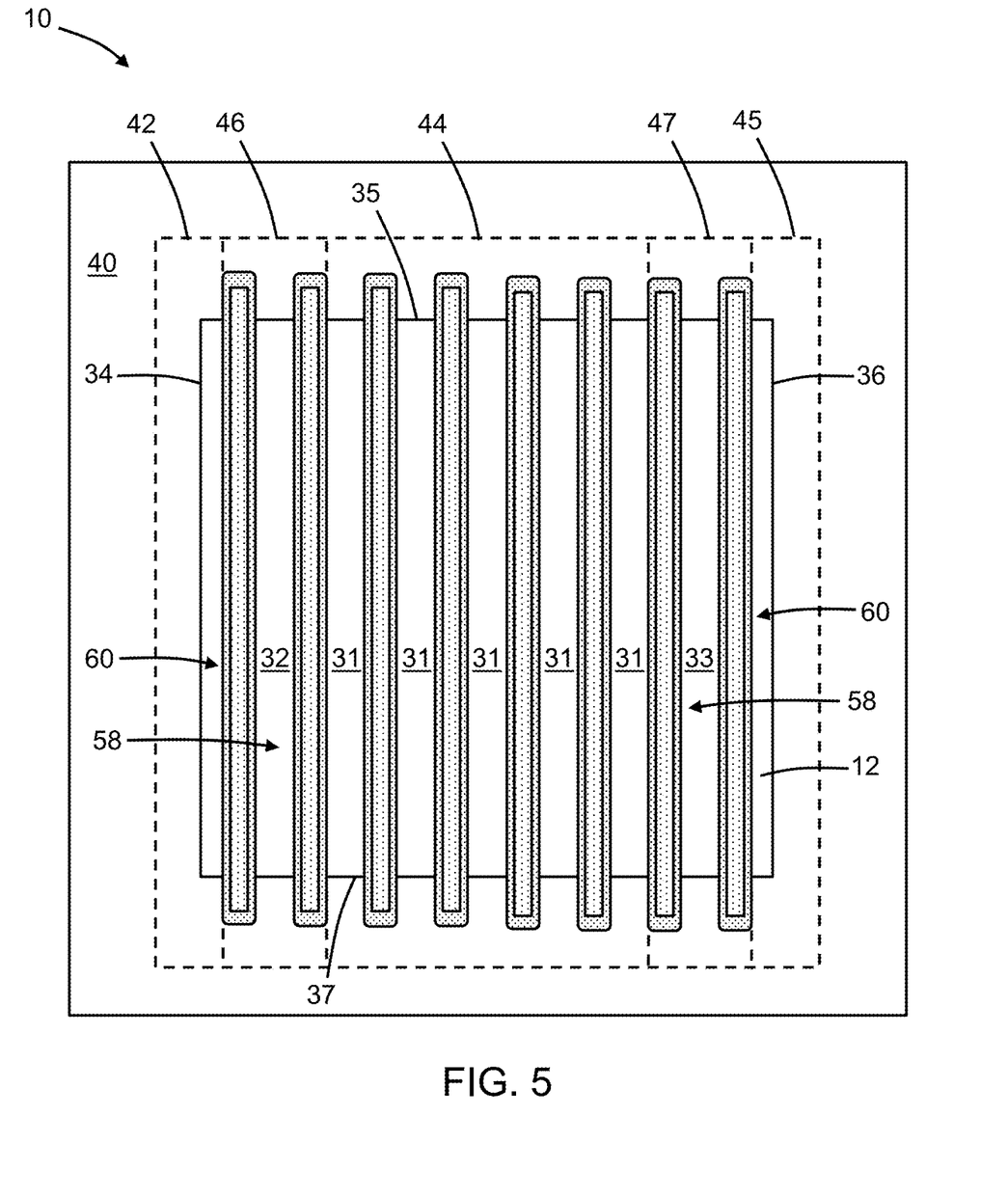
FIG. 5 is a top view of a structure in accordance with alternative embodiments of the invention.

With reference to FIG. 5 and in accordance with alternative embodiments, the structure 10 may be modified to include multiple gate structures 58, 60 that are arranged in an array. The gate structures 58, 60 may have a construction similar, or identical to, the construction of the gate structures 18, 20, 22, 24. The peripheral gate structures 60 proximate to the side edge 34 and the side edge 36 of the semiconductor layer 12 may be inactive gates. The centrally-located gate structures 58 may be coupled by the contacts 50 to the metal feature 51, as shown in FIG. 2, and represent active gates. The number of centrally-located gate structures 58 serving as active gates may be varied in the construction of the field-effect transistor.

An additional doped region 45 may be formed in the semiconductor substrate 16 when the doped regions 42, 44 are formed. A doped region 47, which is similar to the doped region 46, is formed in the semiconductor substrate 16 when the doped regions 42, 44, 45 are formed. The doped region 47, which represents another portion of the semiconductor substrate 16 that is masked during the formation of the doped regions 42, 44, 45, may extend in the semiconductor substrate 16 from the side edge 35 of the semiconductor layer 12 to the opposite side edge 37 of the semiconductor layer 12, as well as outwardly beyond the side edge 35 and the side edge 37 into the hybrid region 15 to intersect the oppositely-doped well 40. The doped region 47 is represented by a strip of the semiconductor material of the semiconductor substrate 16 that is positioned laterally between the doped region 44 and the doped region 45 and that extends from a portion of the well 40 adjacent to the side edge 35 to a portion of the well 40 adjacent to the side edge 37. The doped region 44 may laterally separate the doped region 46 from the doped region 47.

The source/drain region 32 and the source/drain region 33 may represent input/output terminals of the field-effect transistor, and multiple source/drain regions 31 may be arranged laterally between the centrally-located gate structures 58 serving as active gates. The source/drain region 31 overlaps with the doped region 44, the source/drain region 32 overlaps with the doped region 46, and the source/drain region 33 overlaps with the doped region 47. In an embodiment, the source/drain region 32 may fully overlap with the doped region 46 and the source/drain region 33 may fully overlap with the doped region 47.

The structure may represent a six-stack switch field-effect transistor in which the source/drain regions 32, 33 providing the input/output terminals present a low capacitance due to the high resistivity of the underlying doped regions 46, 47. The voltage supplied to the source/drain regions 32, 33 is divided over the gate structures 58 and source/drain regions 31. A bias applied to the well 40 may be effective to reduce the threshold voltage of the gate structures 58 over the doped region 44 that is electrically and physically coupled to the well 40. The threshold voltage of the gate structure 58 over the doped region 46 and threshold voltage of the gate structure 58 over the doped region 47 are not changed by the bias applied to the well 40. A bias applied to the well 40 operates as a connection to the doped regions 42, 44, 45 for draining charge carriers to prevent the formation of an inversion layer in the doped regions 46, 47. The structure 10 embodied in the switch field-effect transistor may exhibit an improved area efficiency and a more consistent field control in comparison with conventional device structures for a switch field-effect transistor.

Figure 6:
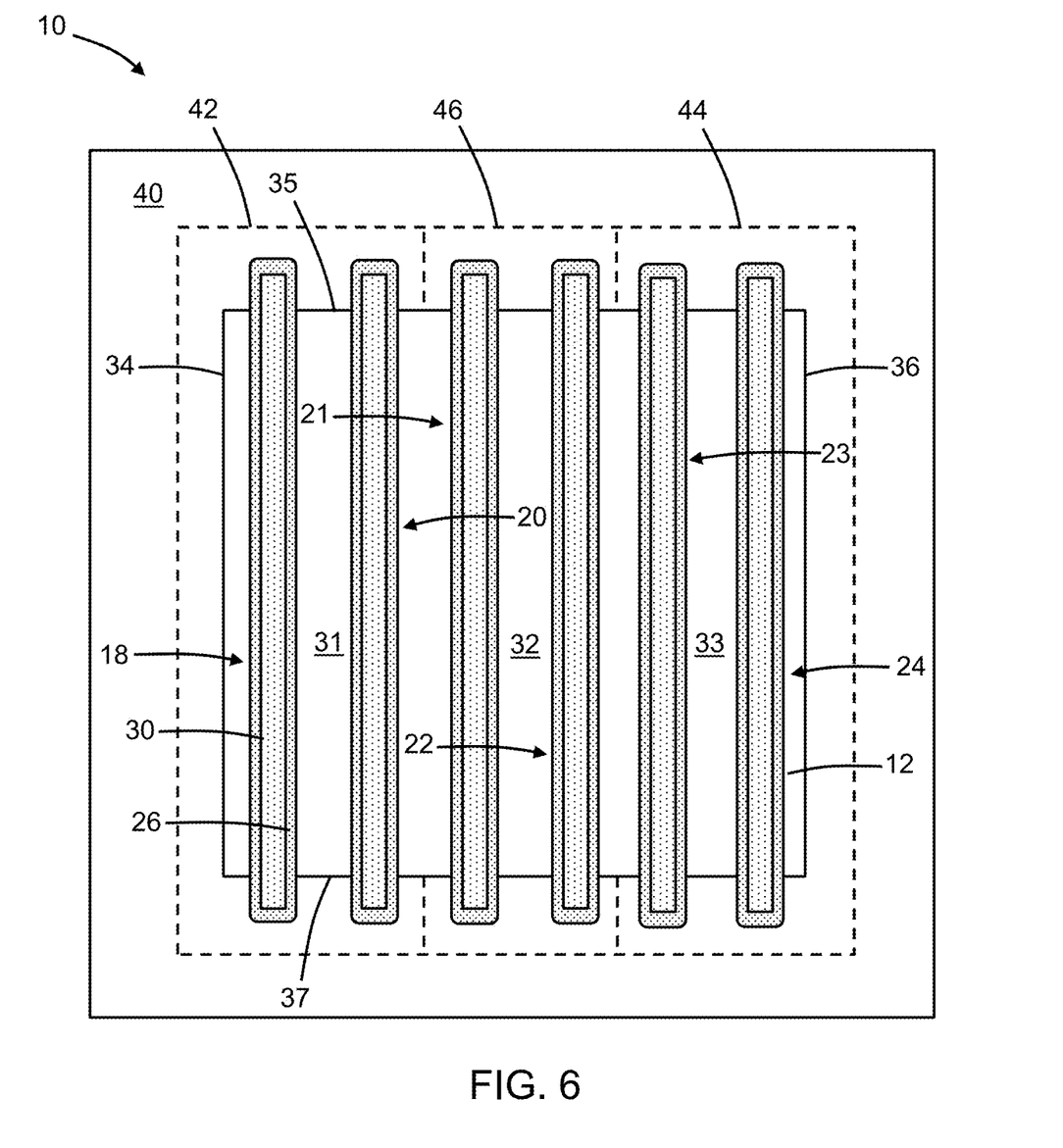
FIG. 6 is a top view of a structure in accordance with alternative embodiments of the invention.

With reference to FIG. 6 and in accordance with alternative embodiments, additional gate structures 21, 23 may be added that have a construction similar, or identical to, the construction of the gate structures 18, 20, 22, 24. The source/drain region 31, which overlaps with the doped region 42, is laterally positioned between the gate structure 18 and the gate structure 20. The source/drain region 32, which overlaps with the doped region 46, is laterally positioned between the gate structure 21 and the gate structure 22. The source/drain region 33, which overlaps with the doped region 44, is laterally positioned between the gate structure 23 and the gate structure 24.

The gate structure 20 and the gate structure 23 may be coupled together in a stack to provide a common-source stage of a cascode amplifier, the gate structure 21 and the gate structure 22 may be coupled together to provide a common-gate stage of the cascode amplifier, the source/drain region 31 and the source/drain region 33 may represent source terminals, and the source/drain region 32 may represent a drain terminal. The gate structure 18 and the gate structure 24 may be inactive gates in the cascode amplifier. The drain terminal represented by the source/drain region 32 may present a low capacitance to the doped region 46 having a higher resistivity than the doped regions 42, 44, and harmonics may be managed via the depletion under the drain terminal. A bias applied to the well 40 operates as a connection to the doped regions 42, 44 for draining charge carriers to prevent the formation of an inversion layer in the doped region 46. The gain is set by the common-source stage with the biasing of the doped regions 42, 44 also used for threshold tuning. The structure 10 embodied in the cascode amplifier may exhibit an improved area efficiency and a more consistent field control in comparison with conventional device structures for a cascode amplifier.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value or precise condition as specified. In embodiments, language of approximation may indicate a range of +/−10% of the stated value(s) or the stated condition(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal plane, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a silicon-on-insulator substrate including a semiconductor layer, a semiconductor substrate, and a dielectric layer between the semiconductor layer and the semiconductor substrate, the semiconductor substrate including a first doped region and a second doped region, the first doped region having a first conductivity type, and the second doped region having a second conductivity type different from the first conductivity type;
    a first source/drain region in the semiconductor layer, the first source/drain region overlapping with the first doped region;

a second source/drain region in the semiconductor layer, the second source/drain region overlapping with the second doped region; and
a first gate structure laterally between the first source/drain region and the second source/drain region,
wherein the semiconductor substrate includes a third doped region having the second conductivity type, the first doped region is laterally positioned between the second doped region and the third doped region, the first gate structure has a width, and the second doped region is laterally spaced from the third doped region by a distance greater than two times the width of the first gate structure.

2. The structure of claim 1 further comprising:
a second gate structure,
wherein the first source/drain region is positioned laterally between the first gate structure and the second gate structure.

3. The structure of claim 2 wherein the first gate structure and the second gate structure overlap with the first doped region.

4. The structure of claim 2 wherein the first doped region and the second doped region adjoin along an interface, and the first gate structure is aligned with the interface.

5. The structure of claim 2 wherein the first doped region and the second doped region adjoin along an interface, and the first gate structure is non-aligned with the interface.

6. The structure of claim 2 further comprising:
a third gate structure,
wherein the second source/drain region is positioned laterally between the first gate structure and the third gate structure.

7. The structure of claim 6 wherein the third gate structure overlaps with the second doped region.

8. The structure of claim 6 where the first source/drain region is a drain terminal, and the second source/drain region is a source terminal.

9. The structure of claim 1 where the first source/drain region is a drain terminal, and the second source/drain region is a source terminal.

10. The structure of claim 1 wherein the silicon-on-insulator substrate includes an active region and a hybrid region, the first source/drain region and the second source/drain region are positioned in the active region, and further comprising:
a well in the hybrid region of the semiconductor substrate, wherein the well has the second conductivity type, and the second doped region is coupled to the well.

11. The structure of claim 10 wherein the first conductivity type is p-type, and the second conductivity type is n-type.

12. The structure of claim 1 further comprising:
a third source/drain region in the semiconductor layer, the third source/drain region overlapping with the third doped region.

13. The structure of claim 12 wherein the first source/drain region is a drain terminal, and the second source/drain region and the third source/drain region are source terminals.

14. The structure of claim 12 wherein the first source/drain region and the third source/drain region are input/output terminals.

15. The structure of claim 1 wherein the dielectric layer has a thickness in a range of about 4 nanometers to about 40 nanometers.

16. The structure of claim 1 wherein the semiconductor layer has a first side edge and a second side edge, and the second doped region extends in the semiconductor substrate from the first side edge of the semiconductor layer to the second side edge of the semiconductor layer.

17. The structure of claim 16 wherein the silicon-on-insulator substrate includes an active region and a hybrid region, the first source/drain region and the second source/drain region are positioned in the active region, and the second doped region extends outwardly beyond the first side edge and the second side edge into the hybrid region.

18. The structure of claim 17 further comprising:
a well in the hybrid region of the semiconductor substrate, wherein the well has the second conductivity type, and the second doped region is coupled to the well.

19. The structure of claim 17 wherein the third doped region extends in the semiconductor substrate from the first side edge of the semiconductor layer to the second side edge of the semiconductor layer, and the third doped region extends outwardly beyond the first side edge and the second side edge into the hybrid region.

20. A method comprising:
forming a first doped region and a second doped region in a semiconductor substrate of a silicon-on-insulator substrate, wherein the silicon-on-insulator substrate includes a semiconductor layer and a dielectric layer between the semiconductor layer and the semiconductor substrate, the first doped region has a first conductivity type, and the second doped region has a second conductivity type different from the first conductivity type;
forming a first source/drain region in the semiconductor layer, wherein the first source/drain region overlaps with the first doped region;
forming a second source/drain region in the semiconductor layer, wherein the second source/drain region overlaps with the second doped region; and
forming a gate structure laterally between the first source/drain region and the second source/drain region,
wherein the semiconductor substrate includes a third doped region having the second conductivity type, the first doped region is laterally positioned between the second doped region and the third doped region, the gate structure has a width, and the second doped region is laterally spaced from the third doped region by a distance greater than two times the width of the gate structure.

* * * * *